(12) United States Patent
Xu et al.

(10) Patent No.: US 8,788,991 B2
(45) Date of Patent: Jul. 22, 2014

(54) STATE GROUPING FOR ELEMENT UTILIZATION

(75) Inventors: Junjuan Xu, San Jose, CA (US); Paul Glendenning, Woodside, CA (US)

(73) Assignee: Micron Technology, Inc., Boise, ID (US)

( * ) Notice: Subject to any disclaimer, the term of this patent is extended or adjusted under 35 U.S.C. 154(b) by 207 days.

(21) Appl. No.: 13/357,511

(22) Filed: Jan. 24, 2012

(65) Prior Publication Data
US 2012/0192166 A1 Jul. 26, 2012

Related U.S. Application Data

(60) Provisional application No. 61/436,075, filed on Jan. 25, 2011.

(51) Int. Cl.
*G06F 17/50* (2006.01)
(52) U.S. Cl.
USPC ............................ 716/104; 716/116; 716/126
(58) Field of Classification Search
CPC ....................................................... G06F 17/50
USPC .......................................... 716/104, 116, 126
See application file for complete search history.

(56) References Cited

U.S. PATENT DOCUMENTS 5,784,298 A * 7/1998 Hershey et al. ................. 714/39
6,262,594 B1 * 7/2001 Cheung et al. .................. 326/38
2003/0145304 A1 7/2003 Carter
2005/0268258 A1 12/2005 Decker
2010/0325633 A1 12/2010 Eguro et al.

FOREIGN PATENT DOCUMENTS

TW 201239765 A 10/2012
WO WO-2012103151 A2 8/2012

OTHER PUBLICATIONS

"International Application Serial No. PCT/US2012/022441, Written Opinion mailed Aug. 31, 2012", 3 pgs.
"International Application Serial No. PCT/US2012/022444, International Preliminary Report on Patentability mailed Aug. 8, 2013", 5 pgs.
"International Application Serial No. PCT/US2012/022444, Search Report mailed Aug. 31, 2012", 3 pgs.
Vasiliadis, Giorgos, et al., "Regular Expression Matching on Graphics Hardware for Intrusion Detection", Proceedings of the 12th International Symposium on Recent Advances in Intrusion Detection, See pp. 267-270, 272-274, (2009), 265-283.

* cited by examiner

*Primary Examiner* — Thuan Do
(74) *Attorney, Agent, or Firm* — Schwegman, Lundberg & Woessner, P.A.

(57) ABSTRACT

Embodiments of a system and method for generating an image configured to program a parallel machine from source code are disclosed. One such parallel machine includes a plurality of state machine elements (SMEs) grouped into pairs, such that SMEs in a pair have a common output. One such method includes converting source code into an automaton comprising a plurality of interconnected states, and converting the automaton into a netlist comprising instances corresponding to states in the automaton, wherein converting includes pairing states corresponding to pairs of SMEs based on the fact that SMEs in a pair have a common output. The netlist can be converted into the image and published.

38 Claims, 9 Drawing Sheets

STATE GROUPING FOR ELEMENT UTILIZATION

CLAIM OF PRIORITY

This patent application claims the benefit of priority, under 35 U.S.C. Section 119(e), to U.S. Provisional Patent Application Ser. No. 61/436,075, titled "STATE GROUPING FOR ELEMENT UTILIZATION," filed on Jan. 25, 2011, which is hereby incorporated by reference herein in its entirety.

BACKGROUND

A compiler for a parallel machine converts source code into machine code (e.g., an image) for configuring (e.g., programming) the parallel machine. The machine code can implement a finite state machine on the parallel machine. One stage of the process of converting the source code into machine code includes forming a netlist. A netlist describes the connectivity between instances of the hardware elements of the parallel machine. The netlist can describe connections between the hardware elements such that the hardware elements implement the functionality of the source code.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

This document describes, among other things, a compiler that generates a netlist based on a physical design of the parallel machine. In an example, the physical design of the parallel machine can include connectivity limitations between state machine elements of the parallel machine. For example, the state machine elements in the parallel machine can be grouped into pairs that share a common output. Accordingly, the compiler can generate a netlist based on a physical design where pairs of SMEs share a common output.

Figure 1:
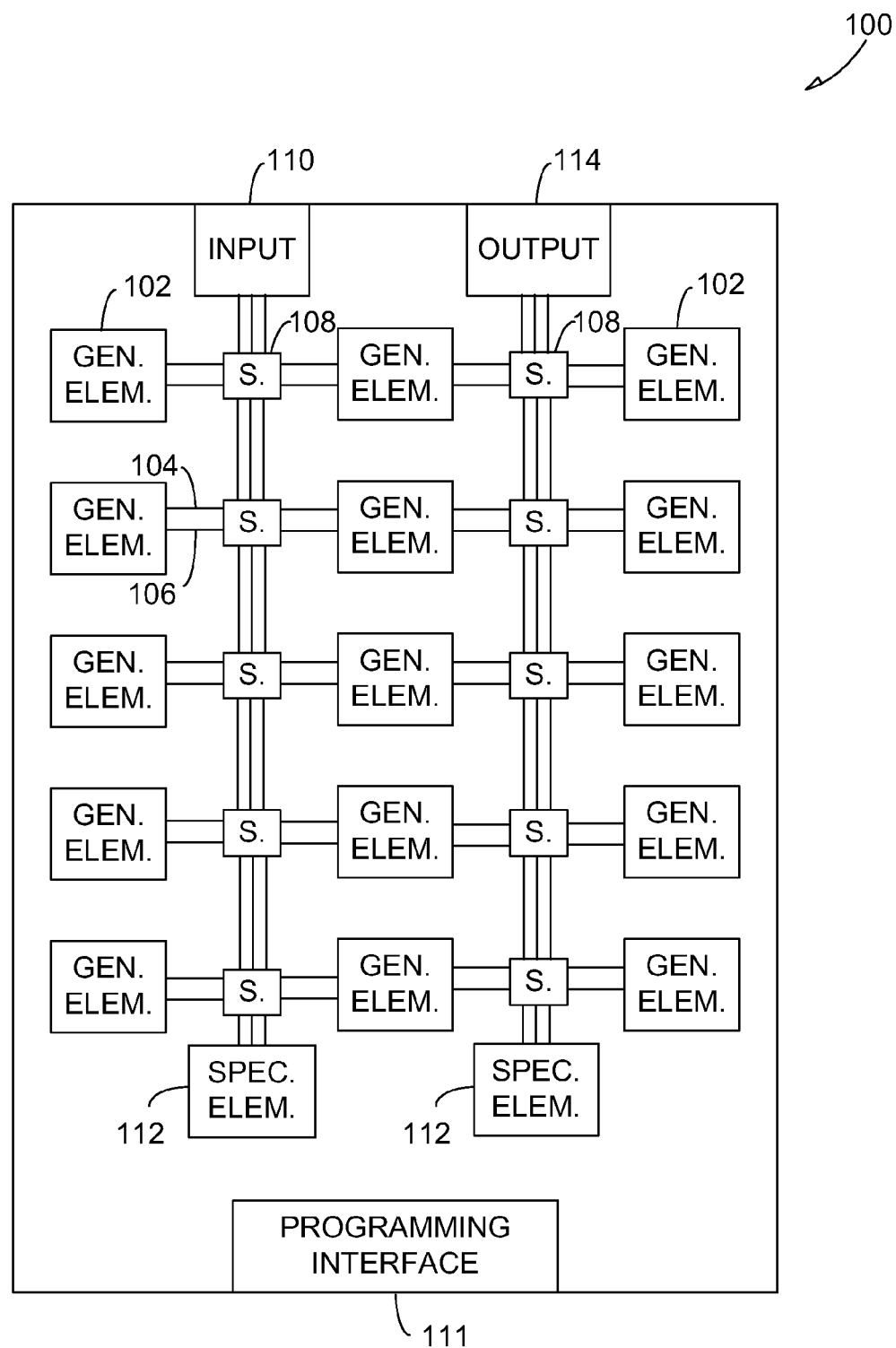
FIG. 1 illustrates an example of a parallel machine, according to various embodiments of the invention.

FIG. 1 illustrates an example parallel machine 100. The parallel machine 100 can receive input data and provide an output based on the input data. The parallel machine 100 can include a data input port 110 for receiving input data and an output port 114 for providing an output to another device. The data input port 110 provides an interface for data to be input to the parallel machine 100.

The parallel machine 100 includes a plurality of programmable elements including general purpose elements 102 and special purpose elements 112. A general purpose element 102 can include one or more inputs 104 and one or more outputs 106. A general purpose element 102 can be programmed into one of a plurality of states. The state of the general purpose element 102 determines what output(s) the general purpose elements 102 will provide based on a given input(s). That is, the state of the general purpose element 102 determines how the programmable element will react based on a given input. Data input to the data input port 110 can be provided to the plurality of general purpose elements 102 to cause the general purpose elements 102 to take action thereon. Examples of a general purpose element 102 can include a state machine element (SME) discussed in detail below, and a configurable logic block. In an example, a SME can be set in a given state to provide a certain output (e.g., a high or "1" signal) when a given input is received at the data input port 110. When an input other than the given input is received at the data input port 110, the SME can provide a different output (e.g., a low or "0" signal). In an example, a configurable logic block can be set to perform a Boolean logic function (e.g., AND, OR, NOR, ext.) based on input received at the data input port 110.

The parallel machine 100 can also include a programming interface 111 for loading a program (e.g., an image) onto the parallel machine 100. The image can program (e.g., set) the state of the general purpose elements 102. That is, the image can configure the general purpose elements 102 to react in a certain way to a given input. For example, a general purpose element 102 can be set to output a high signal when the character 'a' is received at the data input port 110. In some examples, the parallel machine 100 can use a clock signal for controlling the timing of operation of the general purpose elements 102. In certain examples, the parallel machine 100 can include special purpose elements 112 (e.g., RAM, logic gates, counters, look-up tables, etc.) for interacting with the general purpose elements 102, and for performing special purpose functions. In some embodiments, the data received at the data input port 110 can include a fixed set of data received over time or all at once, or a stream of data received over time. The data may be received from, or generated by, any source, such as databases, sensors, networks, etc, coupled to the parallel machine 100.

The parallel machine 100 also includes a plurality of programmable switches 108 for selectively coupling together different elements (e.g., general purpose element 102, data input port 110, output port 114, programming interface 111, and special purpose elements 112) of the parallel machine 100. Accordingly, the parallel machine 100 comprises a programmable matrix formed among the elements. In an example, a programmable switch 108 can selectively couple two or more elements to one another such that an input 104 of a general purpose element 102, the data input port 110, a programming interface 111, or special purpose element 112 can be coupled through one or more programmable switches 108 to an output 106 of a general purpose element 102, the output port 114, a programming interface 111, or special purpose element 112. Thus, the routing of signals between the elements can be controlled by setting the programmable switches 108. Although FIG. 1 illustrates a certain number of conductors (e.g., wires) between a given element and a programmable switch 108, it should be understood that in other examples, a different number of conductors can be used. Also, although FIG. 1 illustrates each general purpose element 102 individually coupled to a programmable switch 108, in other examples, multiple general purpose elements 102 can be coupled as a group (e.g., a block 802, as illustrated in FIG. 8) to a programmable switch 108. In an example, the data input port 110, the data output port 114, and/or the programming interface 111 can be implemented as registers such that writing to the registers provides data to or from the respective elements.

In an example, a single parallel machine 100 is implemented on a physical device, however, in other examples two or more parallel machines 100 can be implemented on a single physical device (e.g., physical chip). In an example, each of multiple parallel machines 100 can include a distinct data input port 110, a distinct output port 114, a distinct programming interface 111, and a distinct set of general purpose elements 102. Moreover, each set of general purpose elements 102 can react (e.g., output a high or low signal) to data at their corresponding input data port 110. For example, a first set of general purpose elements 102 corresponding to a first parallel machine 100 can react to the data at a first data input port 110 corresponding to the first parallel machine 100. A second set of general purpose elements 102 corresponding to a second parallel machine 100 can react to a second data input port 110 corresponding to the second parallel machine 100. Accordingly, each parallel machine 100 includes a set of general purpose elements 102, wherein different sets of general purpose elements 102 can react to different input data. Similarly, each parallel machine 100, and each corresponding set of general purpose elements 102 can provide a distinct output. In some examples, an output port 114 from first parallel machine 100 can be coupled to an input port 110 of a second parallel machine 100, such that input data for the second parallel machine 100 can include the output data from the first parallel machine 100.

In an example, an image for loading onto the parallel machine 100 comprises a plurality of bits of information for setting the state of the general purpose elements 102, programming the programmable switches 108, and configuring the special purpose elements 112 within the parallel machine 100. In an example, the image can be loaded onto the parallel machine 100 to program the parallel machine 100 to provide a desired output based on certain inputs. The output port 114 can provide outputs from the parallel machine 100 based on the reaction of the general purpose elements 102 to data at the data input port 110. An output from the output port 114 can include a single bit indicating a match of a given pattern, a word comprising a plurality of bits indicating matches and non-matches to a plurality of patterns, and a state vector corresponding to the state of all or certain general purpose elements 102 at a given moment.

Example uses for the parallel machine 100 include, pattern-recognition (e.g., speech recognition, image recognition, etc.) signal processing, imaging, computer vision, cryptography, and others. In certain examples, the parallel machine 100 can comprise a finite state machine (FSM) engine, a field programmable gate array (FPGA), and variations thereof. Moreover, the parallel machine 100 may be a component in a larger device such as a computer, pager, cellular phone, personal organizer, portable audio player, network device (e.g., router, firewall, switch, or any combination thereof), control circuit, camera, etc.

FIGS. 2-5 illustrate another parallel machine implemented as a finite state machine (FSM) engine 200. In an example, the FSM engine 200 comprises a hardware implementation of a finite state machine. Accordingly, the FSM engine 200 implements a plurality of selectively coupleable hardware elements (e.g., programmable elements) that correspond to a plurality of states in a FSM. Similar to a state in a FSM, a hardware element can analyze an input stream and activate a downstream hardware element based on the input stream.

The FSM engine 200 includes a plurality of programmable elements including general purpose elements and special purpose elements. The general purpose elements can be programmed to implement many different functions. These general purpose elements include SMEs 204, 205 (shown in FIG. 5) that are hierarchically organized into rows 206 (shown in FIGS. 3 and 4) and blocks 202 (shown in FIGS. 2 and 3). To route signals between the hierarchically organized SMEs 204, 205, a hierarchy of programmable switches is used including inter-block switches 203 (shown in FIGS. 2 and 3), intra-block switches 208 (shown in FIGS. 3 and 4) and intra-row switches 212 (shown in FIG. 4). A SME 204, 205 can correspond to a state of a FSM implemented by the FSM engine 200. The SMEs 204, 205 can be coupled together by using the programmable switches as described below. Accordingly, a FSM can be implemented on the FSM engine 200 by programming the SMEs 204, 205 to correspond to the functions of states and by selectively coupling together the SMEs 204, 205 to correspond to the transitions between states in the FSM.

Figure 2:
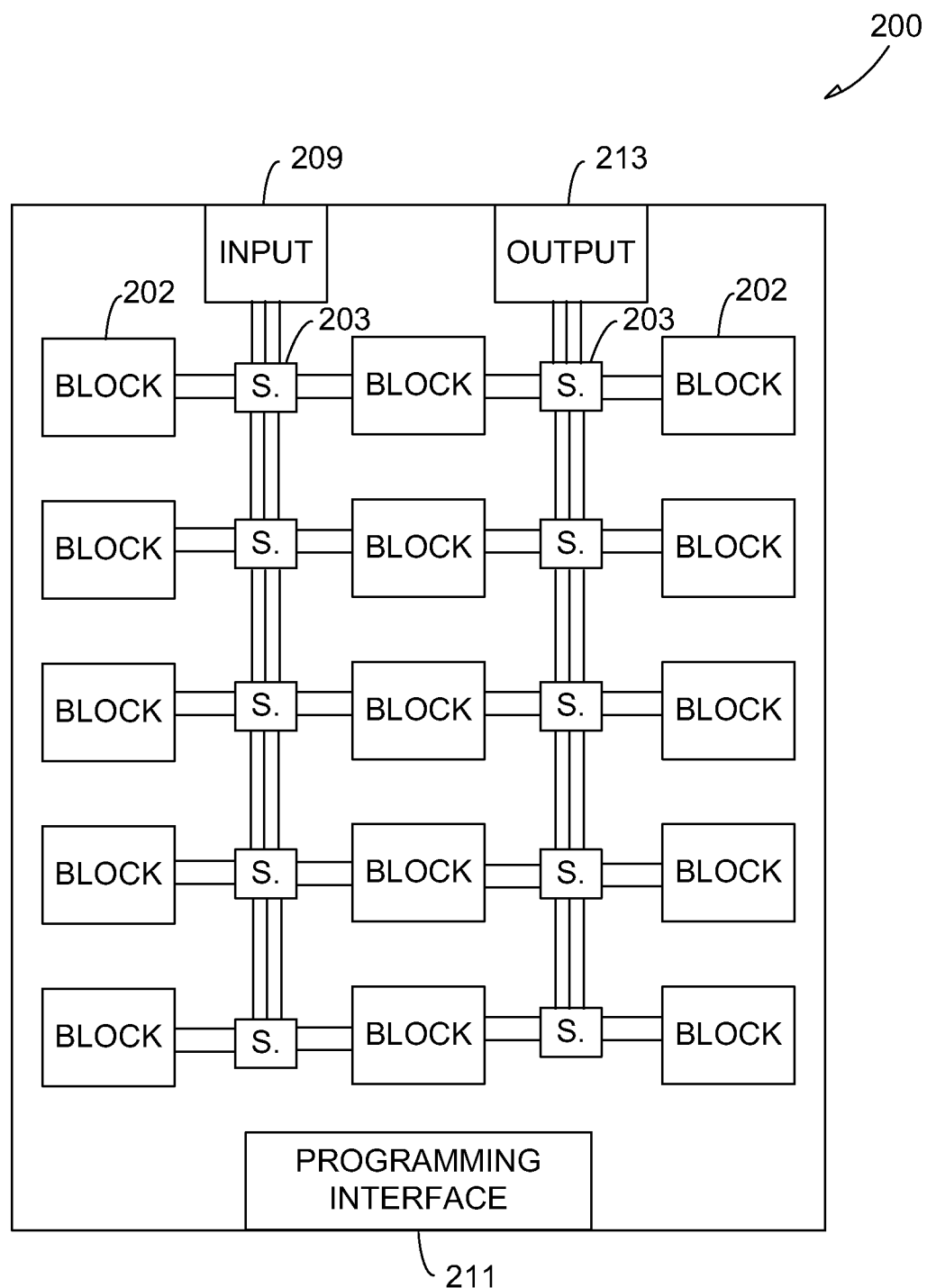
FIG. 2 illustrates an example of the parallel machine of FIG. 1 implemented as a finite state machine engine, according to various embodiments of the invention.

FIG. 2 illustrates an overall view of an example FSM engine 200. The FSM engine 200 includes a plurality of blocks 202 that can be selectively coupled together with programmable inter-block switches 203. Additionally, the blocks 202 can be selectively coupled to an input block 209 (e.g., a data input port) for receiving signals (e.g., data) and providing the data to the blocks 202. The blocks 202 can also be selectively coupled to an output block 213 (e.g., an output port) for providing signals from the blocks 202 to an external device (e.g., another FSM engine 200). The FSM engine 200 can also include a programming interface 211 to load a program (e.g., an image) onto the FSM engine 200. The image can program (e.g., set) the state of the SMEs 204, 205. That is, the image can configure the SMEs 204, 205 to react in a certain way to a given input at the input block 209. For example, a SME 204 can be set to output a high signal when the character 'a' is received at the input block 209.

In an example, the input block 209, the output block 213, and/or the programming interface 211 can be implemented as registers such that writing to the registers provides data to or from the respective elements. Accordingly, bits from the image stored in the registers corresponding to the programming interface 211 can be loaded on the SMEs 204, 205. Although FIG. 2 illustrates a certain number of conductors (e.g., wire, trace) between a block 202, input block 209, output block 213, and an inter-block switch 203, it should be understood that in other examples, fewer or more conductors can be used.

Figure 3:
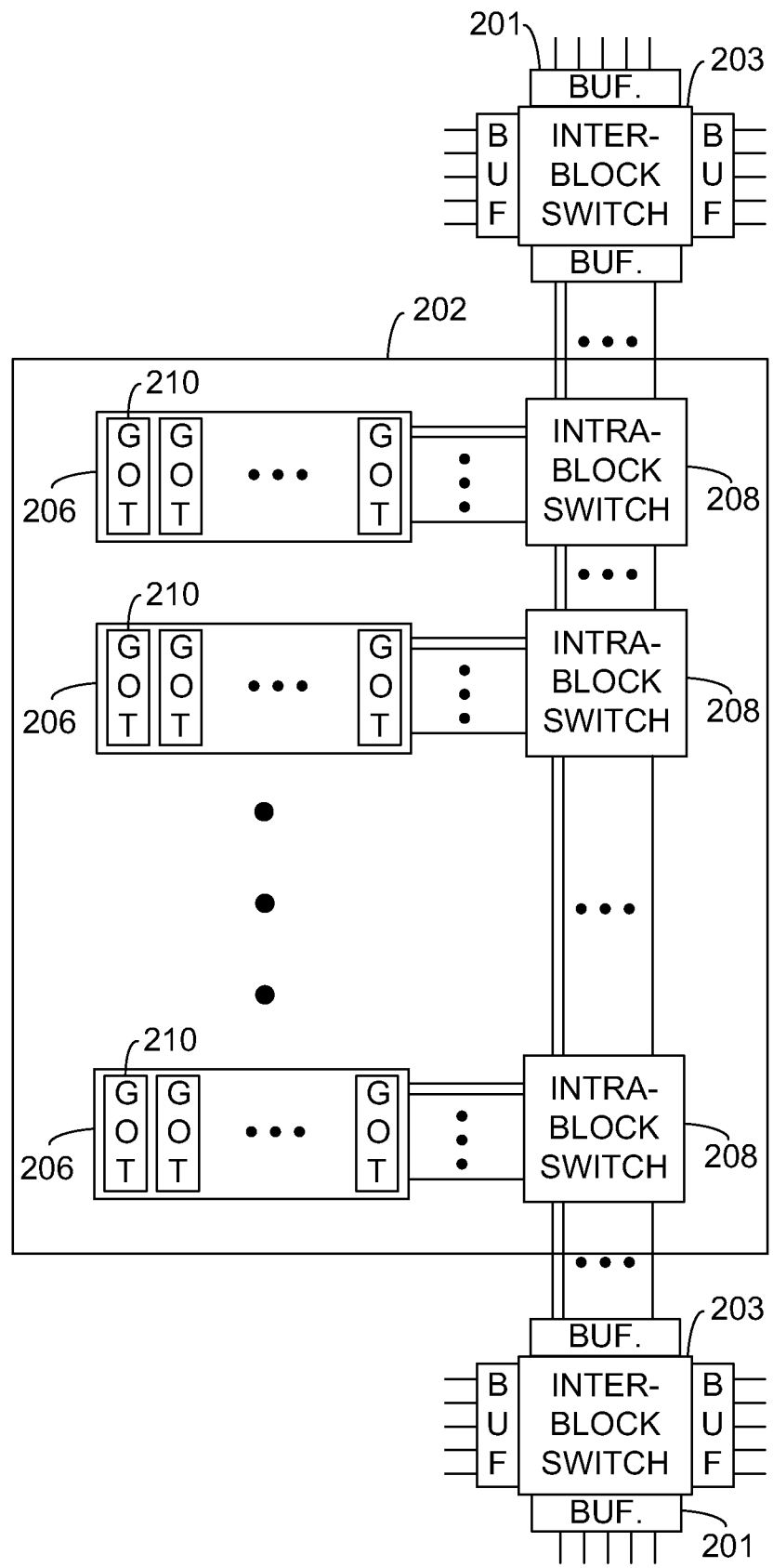
FIG. 3 illustrates an example of a block of the finite state machine engine of FIG. 2, according to various embodiments of the invention.

FIG. 3 illustrates an example of a block 202. A block 202 can include a plurality of rows 206 that can be selectively coupled together with programmable intra-block switches 208. Additionally, a row 206 can be selectively coupled to another row 206 within another block 202 with the inter-block switches 203. In an example, buffers 201 are included to control the timing of signals to/from the inter-block switches 203. A row 206 includes a plurality of SMEs 204, 205 organized into pairs of elements that are referred to herein as groups of two (GOTs) 210. In an example, a block 202 comprises sixteen (16) rows 206.

Figure 4:
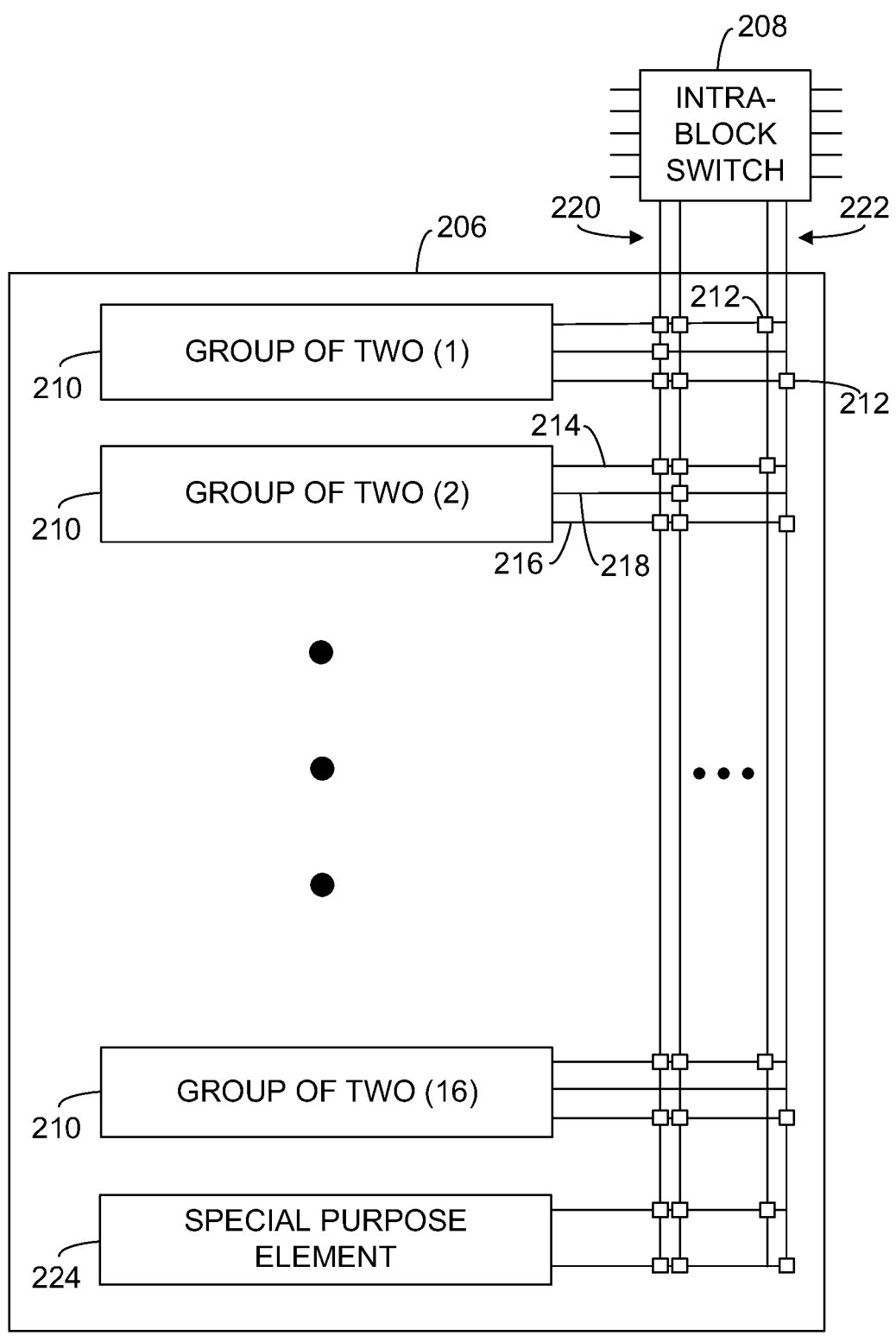
FIG. 4 illustrates an example of a row of the block of FIG. 3, according to various embodiments of the invention.

FIG. 4 illustrates an example of a row 206. A GOT 210 can be selectively coupled to other GOTs 210 and any other elements 224 within the row 206 by programmable intra-row switches 212. A GOT 210 can also be coupled to other GOTs 210 in other rows 206 with the intra-block switch 208, or other GOTs 210 in other blocks 202 with an inter-block switch 203. In an example, a GOT 210 has a first and second input 214, 216, and an output 218. The first input 214 is coupled to a first SME 204 of the GOT 210 and the second input 214 is coupled to a second SME 204 of the GOT 210.

In an example, the row 206 includes a first and second plurality of row interconnection conductors 220, 222. In an example, an input 214, 216 of a GOT 210 can be coupled to one or more row interconnection conductors 220, 222, and an output 218 can be coupled to one row interconnection conductor 220, 222. In an example, a first plurality of the row interconnection conductors 220 can be coupled to each SME 204 of each GOT 210 within the row 206. A second plurality of the row interconnection conductors 222 can be coupled to one SME 204 of each GOT 210 within the row 206, but cannot be coupled to the other SME 204 of the GOT 210. In an example, a first half of the second plurality of row interconnection conductors 222 can couple to first half of the SMEs 204 within a row 206 (one SME 204 from each GOT 210) and a second half of the second plurality of row interconnection conductors 222 can couple to a second half of the SMEs 204 within a row 206 (the other SME 204 from each GOT 210). The limited connectivity between the second plurality of row interconnection conductors 222 and the SMEs 204, 205 is referred to herein as "parity".

In an example, the row 206 can also include a special purpose element 224 such as a counter, a programmable Boolean logic element, a field programmable gate array (FPGA), an application specific integrated circuit (ASIC), a programmable processor (e.g., a microprocessor), and other elements. Additionally, in an example, the special purpose element 224 is different in different rows 206. For example four of the rows 206 in a block 202 can include Boolean logic as the special purpose element 224, and the other eight rows 206 in a block 202 can include a counter as the special purpose element 224.

In an example, the special purpose element 224 includes a counter (also referred to herein as counter 224). In an example, the counter 224 comprises a 12-bit programmable down counter. The 12-bit programmable counter 224 has a counting input, a reset input, and zero-count output. The counting input, when asserted, decrements the value of the counter 224 by one. The reset input, when asserted, causes the counter 224 to load an initial value from an associated register. For the 12-bit counter 224, up to a 12-bit number can be loaded in as the initial value. When the value of the counter 224 is decremented to zero (0), the zero-count output is asserted. The counter 224 also has at least two modes, pulse and hold. When the counter 224 is set to pulse mode, the zero-count output is asserted during the first clock cycle when the counter 224 decrements to zero, and at the following clock cycles the zero-count output is no longer asserted even if the counting input is asserted. This state continues until the counter 224 is reset by the reset input being asserted. When the counter 224 is set to hold mode the zero-count output is asserted during the first clock cycle when the counter 224 decrements to zero, and stays asserted when the counting input is asserted until the counter 224 is reset by the reset input being asserted.

Figure 5:
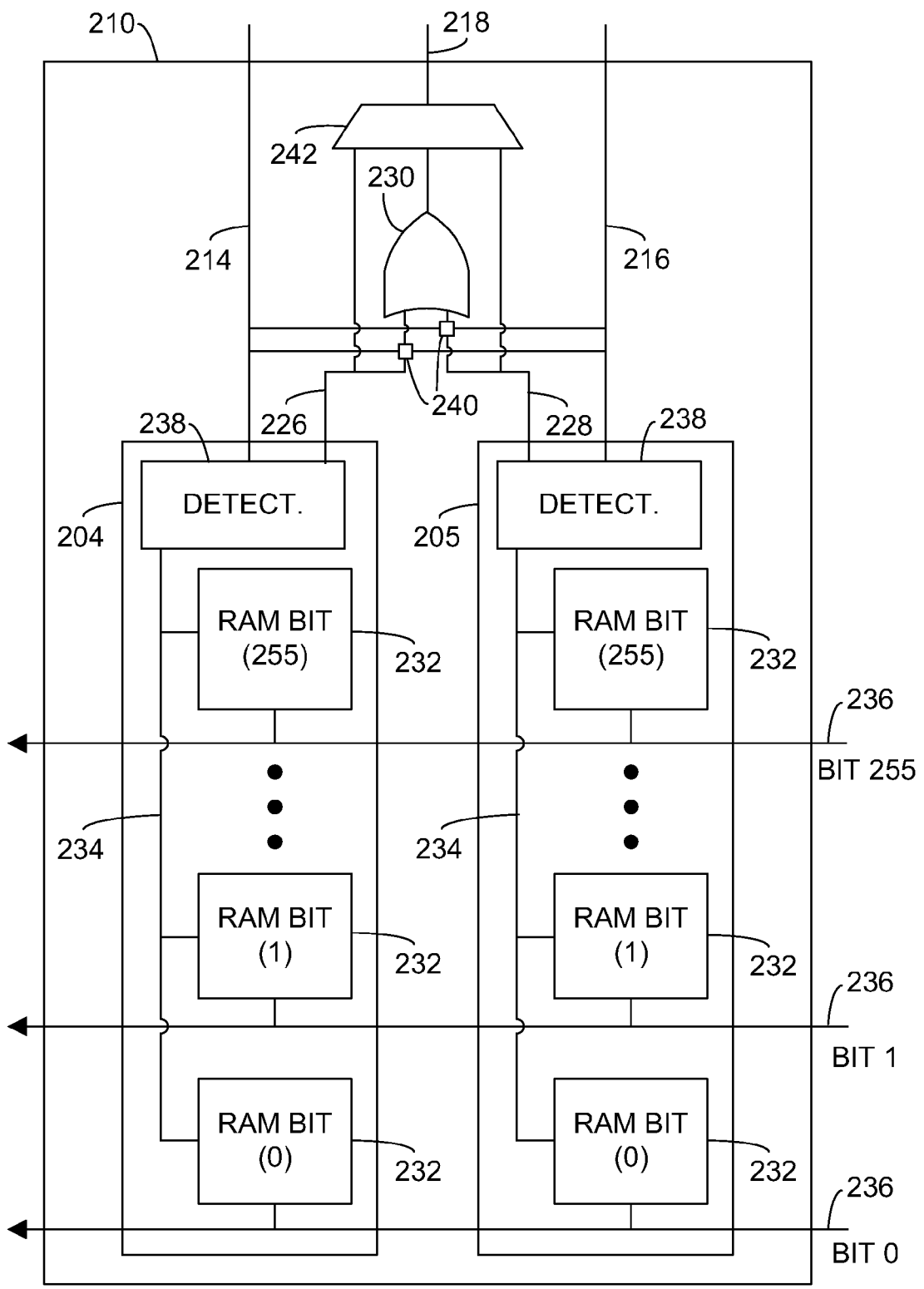
FIG. 5 illustrates an example of a group of two of the row of FIG. 4, according to various embodiments of the invention.

FIG. 5 illustrates an example of a GOT 210. The GOT 210 includes a first SME 204 and a second SME 205 having inputs 214, 216 and having their outputs 226, 228 coupled to an OR gate 230 and a 3-to-1 multiplexer 242. The 3-to-1 multiplexer 242 can be set to couple the output 218 of the GOT 210 to either the first SME 204, the second SME 205, or the OR gate 230. The OR gate 230 can be used to couple together both outputs 226, 228 to form the common output 218 of the GOT 210. In an example, the first and second SME 204, 205 exhibit parity, as discussed above, where the input 214 of the first SME 204 can be coupled to some of the row interconnect conductors 222 and the input 216 of the second SME 205 can be coupled to other row interconnect conductors 222. In an example, the two SMEs 204, 205 within a GOT 210 can be cascaded and/or looped back to themselves by setting either or both of switches 240. The SMEs 204, 205 can be cascaded by coupling the output 226, 228 of the SMEs 204, 205 to the input 214, 216 of the other SME 204, 205. The SMEs 204, 205 can be looped back to themselves by coupling the output 226, 228 to their own input 214, 216. Accordingly, the output 226 of the first SME 204 can be coupled to neither, one, or both of the input 214 of the first SME 204 and the input 216 of the second SME 205.

In an example, a state machine element 204, 205 comprises a plurality of memory cells 232, such as those often used in dynamic random access memory (DRAM), coupled in parallel to a detect line 234. One such memory cell 232 comprises a memory cell that can be set to a data state, such as one that corresponds to either a high or a low value (e.g., a 1 or 0). The output of the memory cell 232 is coupled to the detect line 234 and the input to the memory cell 232 receives signals based on data on the data stream line 236. In an example, an input on the data stream line 236 is decoded to select one of the memory cells 232. The selected memory cell 232 provides its stored data state as an output onto the detect line 234. For example, the data received at the data input port 209 can be provided to a decoder (not shown) and the decoder can select one of the data stream lines 236. In an example, the decoder can convert an ACSII character to 1 of 256 bits.

A memory cell 232, therefore, outputs a high signal to the detect line 234 when the memory cell 232 is set to a high value and the data on the data stream line 236 corresponds to the memory cell 232. When the data on the data stream line 236 corresponds to the memory cell 232 and the memory cell 232 is set to a low value, the memory cell 232 outputs a low signal to the detect line 234. The outputs from the memory cells 232 on the detect line 234 are sensed by a detect circuit 238. In an example, the signal on an input line 214, 216 sets the respective detect circuit 238 to either an active or inactive state. When set to the inactive state, the detect circuit 238 outputs a low signal on the respective output 226, 228 regardless of the signal on the respective detect line 234. When set to an active state, the detect circuit 238 outputs a high signal on the respective output line 226, 228 when a high signal is detected from one of the memory cells 234 of the respective SME 204, 205. When in the active state, the detect circuit 238 outputs a low signal on the respective output line 226, 228 when the signals from all of the memory cells 234 of the respective SME 204, 205 are low.

In an example, an SME 204, 205 includes 256 memory cells 232 and each memory cell 232 is coupled to a different data stream line 236. Thus, an SME 204, 205 can be programmed to output a high signal when a selected one or more of the data stream lines 236 have a high signal thereon. For example, the SME 204 can have a first memory cell 232 (e.g., bit 0) set high and all other memory cells 232 (e.g., bits 1-255) set low. When the respective detect circuit 238 is in the active state, the SME 204 outputs a high signal on the output 226 when the data stream line 236 corresponding to bit 0 has a high signal thereon. In other examples, the SME 204 can be set to output a high signal when one of multiple data stream lines 236 have a high signal thereon by setting the appropriate memory cells 232 to a high value.

In an example, a memory cell 232 can be set to a high or low value by reading bits from an associated register. Accordingly, the SMEs 204 can be programmed by storing an image created by the compiler into the registers and loading the bits in the registers into associated memory cells 232. In an example, the image created by the compiler includes a binary image of high and low (e.g., 1 and 0) bits. The image can program the FSM engine 200 to operate as a FSM by cascading the SMEs 204, 205. For example, a first SME 204 can be set to an active state by setting the detect circuit 238 to the active state. The first SME 204 can be set to output a high signal when the data stream line 236 corresponding to bit 0 has a high signal thereon. The second SME 205 can be initially set to an inactive state, but can be set to, when active, output a high signal when the data stream line 236 corresponding to bit 1 has a high signal thereon. The first SME 204 and the second SME 205 can be cascaded by setting the output 226 of the first SME 204 to couple to the input 230 of the second SME 205. Thus, when a high signal is sensed on the data stream line 236 corresponding to bit 0, the first SME 204 outputs a high signal on the output 226 and sets the detect circuit 238 of the second SME 205 to an active state. When a high signal is sensed on the data stream line 236 corresponding to bit 1, the second SME 205 outputs a high signal on the output 228 to activate another SME 205 or for output from the FSM engine 200.

Figure 6:
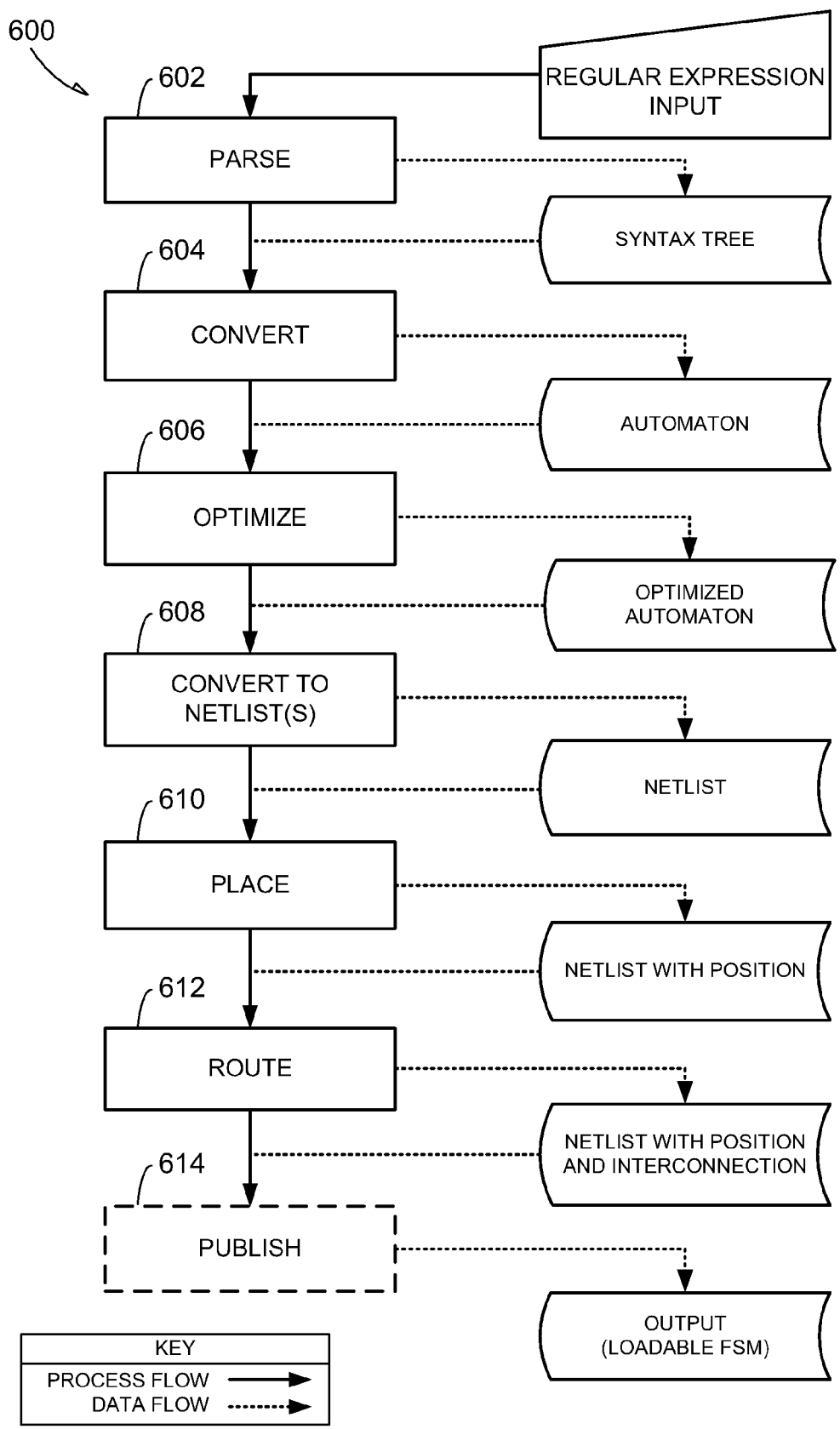
FIG. 6 illustrates an example of a method for a compiler to convert source code into an image configured to program the parallel machine of FIG. 1, according to various embodiments of the invention.

FIG. 6 illustrates an example of a method 600 for a compiler to convert source code into an image configured to program a parallel machine. Method 600 includes parsing the source code into a syntax tree (block 602), converting the syntax tree into an automaton (block 604), optimizing the automaton (block 606), converting the automaton into a netlist (block 608), placing the netlist on hardware (block 610), routing the netlist (block 612), and publishing the resulting image (block 614).

Figure 9:
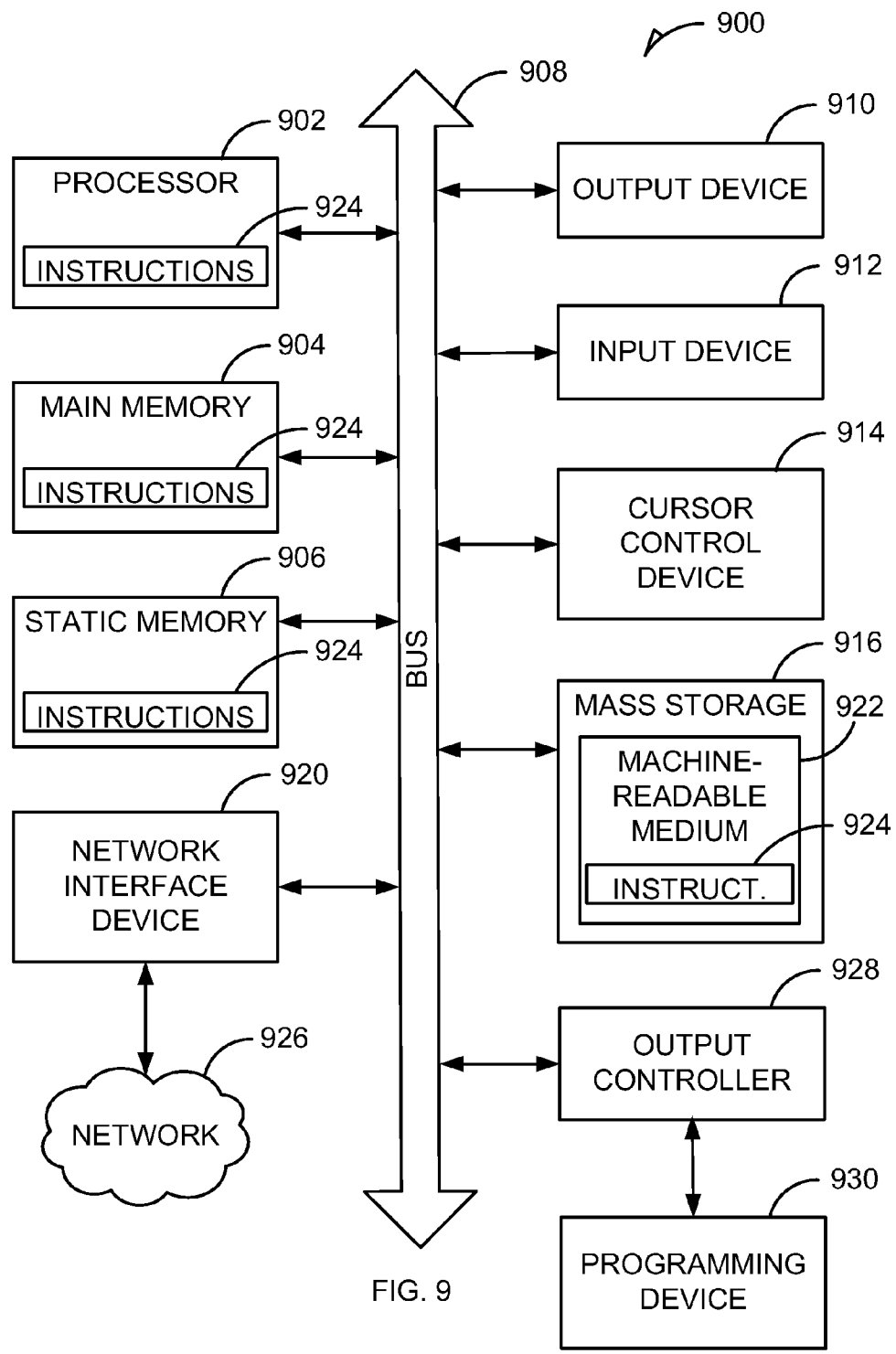
FIG. 9 illustrates an example computer for executing the compiler of FIG. 6 according to various embodiments of the invention.

In an example, the compiler includes an application programming interface (API) that allows software developers to create images for implementing FSMs on the FSM engine 600. The compiler provides methods to convert an input set of regular expressions in the source code into an image that is configured to program the FSM engine 600. The compiler can be implemented by instructions for a computer having a Von Nuemann architecture. These instructions can cause a processor on the computer to implement the functions of the compiler. For example, the instructions, when executed by the processor, can cause the processor to perform actions as described in blocks 602, 604, 606, 608, 610, 612, and 614 on source code that is accessible to the processor. An example computer having a Von Nuemann architecture is shown in FIG. 9 and described below.

In an example, the source code describes search strings for identifying patterns of symbols within a group of symbols. To describe the search strings, the source code can include a plurality of regular expressions (regexes). A regex can be a string for describing a symbol search pattern. Regexes are widely used in various computer domains, such as programming languages, text editors, network security, and others. In an example, the regular expressions supported by the compiler include search criteria for the search of unstructured data. Unstructured data can include data that is free form and has no indexing applied to words within the data. Words can include any combination of bytes, printable and non-printable, within the data. In an example, the compiler can support multiple different source code languages for implementing regexes including Perl, (e.g., Perl compatible regular expressions (PCRE)), PHP, Java, and .NET languages.

Referring back to FIG. 6, at block 602 the compiler can parse the source code to form an arrangement of relationally connected operators, where different types of operators correspond to different functions implemented by the source code (e.g., different functions implemented by regexes in the source code). Parsing source code can create a generic representation of the source code. In an example, the generic representation comprises an encoded representation of the regexes in the source code in the form of a tree graph known as a syntax tree. The examples described herein refer to the arrangement as a syntax tree (also known as an "abstract syntax tree"). In other examples, however, a concrete syntax tree or other arrangement can be used.

Since, as mentioned above, the compiler can support multiple languages of source code, parsing converts the source code, regardless of the language, into a non-language specific representation, e.g., a syntax tree. Thus, further processing (blocks 604, 606, 608, 610) by the compiler can work from a common input structure regardless of the language of the source code.

As noted above, the syntax tree includes a plurality of operators that are relationally connected. A syntax tree can include multiple different types of operators. That is, different operators can correspond to different functions implemented by the regexes in the source code.

At block 604, the syntax tree is converted into an automaton. An automaton (also referred to as a finite-state automaton, finite state machine (FSM), or simply a state machine) is a representation of states, transitions between states and actions and can be classified as deterministic or non-deterministic. A deterministic automaton has a single path of execution at a given time, while a non-deterministic automaton has multiple concurrent paths of execution. The automaton comprises a plurality of states. In order to convert the syntax tree into an automaton, the operators and relationships between the operators in the syntax tree are converted into states with transitions between the states. In an example, the automaton can be converted based partly on the hardware of the FSM engine 200.

In an example, input symbols for the automaton include the symbols of the alphabet, the numerals 0-9, and other printable characters. In an example, the input symbols are represented by the byte values 0 through 255 inclusive. In an example, an automaton can be represented as a directed graph where the nodes of the graph correspond to the set of states. In an example, a transition from state p to state q on an input symbol $\alpha$, i.e., $\delta(p, \alpha)$, is shown by a directed connection from node p to node q. In an example, the language accepted (e.g., matched) by an automaton is the set of all possible character strings which when input sequentially into the automaton will reach a final state. Each string in the language accepted by the automaton traces a path from the start state to one or more final states.

In an example, special transition symbols outside the input symbol range may be used in the automaton. These special transition symbols can be used, for example, to enable use of special purpose elements 224. Moreover, special transition symbols can be used to provide transitions that occur on something other than an input symbol. For example, a special transition symbol may indicate that a first state is to be enabled (e.g., transitioned to) when both a second state and a third state are enabled. Accordingly, the first state is activated when both the second state and the third state are activated, and the transition to the first state is not directly dependent on an input symbol. Notably, a special transition symbol that indicates that a first state is to be enabled when both a second state and a third state are enabled can be used to represent a Boolean AND function performed, for example, by Boolean logic as the special purpose element 224. In an example, a special transition symbol can be used to indicate a counter state has reached zero, and thus transitions to a downstream state.

In an example, the automaton comprises general purpose states as well as special purpose states. The general purpose states and special purpose states correspond to general purpose elements and special purpose elements supported by a target device for which the compiler is generating machine code. Different types of target devices can support different types of general purpose elements as well as one or more different types of special purpose elements. A general purpose element can typically be used to implement a broad range of functions, while a special purpose element can typically be used to implement a more narrow range of functions. In an example, however, a special purpose element can achieve, for example, greater efficiency within its narrow range of function. Accordingly, a special purpose element can be used to, for example, reduce the machine cycles or the machine resources required to implement certain functions in the target device. In some examples, the target device supports solely special purpose elements, wherein multiple different types of special purpose elements are supported.

In an example where the compiler is generating machine code for the FSM engine 200, the general purpose states can correspond to SMEs 204, 205 and the general purpose states are accordingly referred to herein as "SME states". Moreover, when the compiler is generating machine code for the FSM engine 200, one example of a special purpose state can correspond to counters 224 and is accordingly referred to herein as a "counter state". Another example of a special purpose state can correspond to a logic element (e.g., programmable logic, Boolean logic) and is accordingly referred to herein as a "logic state". In an example, the SME states in the automaton map 1:1 to SMEs (e.g., SME 204, 205) in the FSM engine 200 with the exception of the starting state of the automaton which does not map to a SME. The special purpose elements 224 may, or may not, map 1:1 to special purpose states.

In an example, an automaton can be constructed using one of the standard techniques such as Glushkov's method. In an example, the automaton can be an ϵ-free homogeneous automaton. A homogeneous automaton is a restriction on the general automaton definition. The restriction requires that all transitions entering a state must occur on the same input symbol(s). The homogeneous automaton satisfies the following condition: For any two states, $q_1$ and $q_2$, if r∈δ($q_1$)∩δ($q_2$), denote $S_1$={a|a∈Σ, r∈δ($q_1$, a)}, $S_2$={a|a∈δ($q_2$, a)}. $S_1$ is the set of symbols that allows $q_1$ to transition to r; and $S_2$ is the set of symbols that allows $q_2$ to transition to r. Here, $S_1$=$S_2$, i.e. if state $q_1$ and state $q_2$ both transition to state r then the homogeneous restriction is that the transitions must occur on the same symbol(s).

Figure 7A:
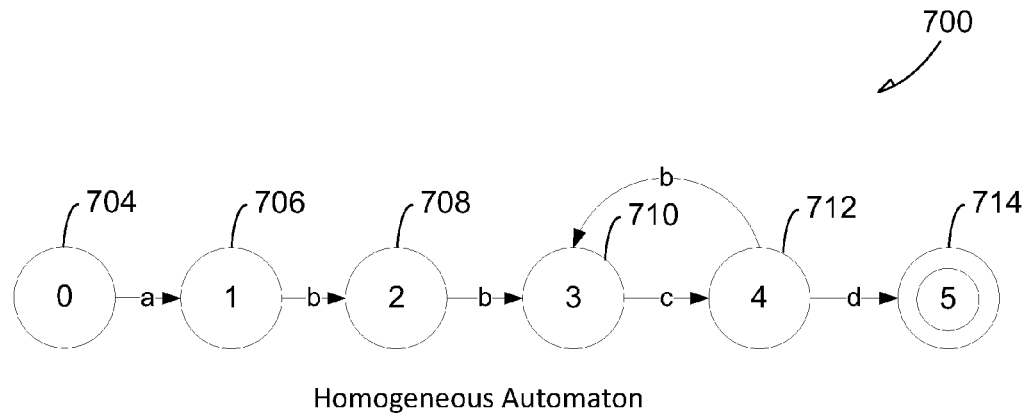
FIGS. 7A and 7B illustrate example automatons according to various embodiments of the invention.
Figure 7B:
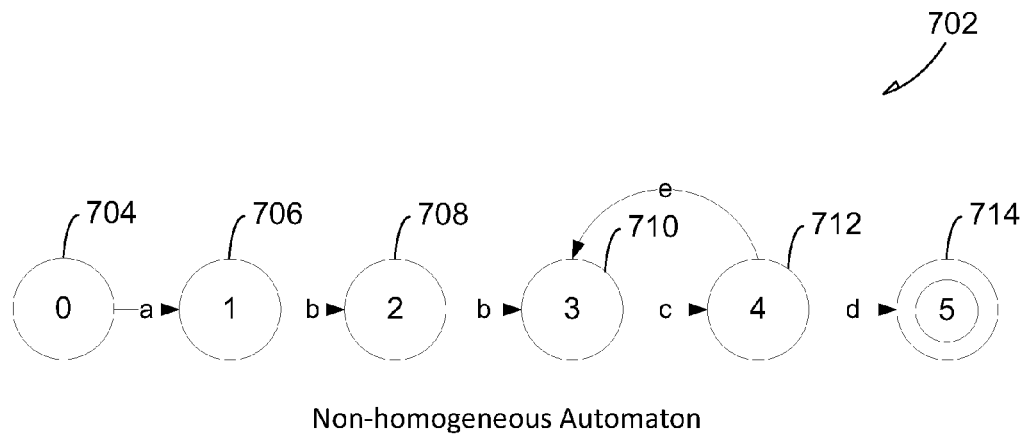

FIGS. 7A and 7B illustrate example automata created from the syntax tree. FIG. 7A illustrates a homogenous automaton 700 and FIG. 7B illustrates a non-homogenous automaton 702.

The homogenous automaton 700 begins at starting state 704 which transitions to state 706 on the input symbol "a". State 706 transitions to state 708 on the input symbol "b" and state 708 transitions to state 710 on the input symbol "b". State 710 transitions to state 712 on the input symbol "c". State 712 transitions to state 710 on the input symbol "b" and transitions to state 714 on the input symbol "d". State 714 is a final state and is identified as such by the double circle. In an example, final states can be significant since activation of a final state indicates a match of a regex corresponding to the automaton. The automaton 700 is a homogeneous automaton since all in-transitions (e.g., a transition into the state) for a given state occur on the same symbol(s). Notably, state 710 has two in-transitions (from state 708 and state 712) and both in-transitions occur on the same symbol "b".

The non-homogeneous automaton 702 includes the same states 704, 706, 708, 710, 712, and 714 as the homogenous automaton 700, however, the state 712 transitions to state 710 on the input symbol "e". Accordingly, the automaton 702 is non-homogeneous since the state 710 has in-transitions on two different symbols; symbol "b" from state 708 and symbol "e" from state 712.

At block 606, after the automaton is constructed, the automaton is optimized to, among other things, reduce its complexity and size. The automaton can be optimized by combining redundant states.

At block 608, the automaton is converted into a netlist. Converting the automaton into a netlist maps the states of the automaton to instances of a hardware element (e.g., SMEs 204, 205, GOT 210, special purpose element 224) of the FSM engine 200, and determines the connections between the instances. In an example, the netlist comprises a plurality of instances, each instance corresponding to (e.g., representing) a hardware element of the FSM engine 200. Each instance can have one or more connection points (also referred to herein as a "port") for connection to another instance. The netlist also comprises a plurality of connections between the ports of the instances which correspond to (e.g., represent) conductors to couple the hardware elements corresponding to the instances. In an example, the netlist comprises different types of instances corresponding to different types of hardware elements. For example, the netlist can include a general purpose instance corresponding to a general purpose hardware element and a special purpose instance corresponding to a special purpose hardware element. As an example, general purpose states can be converted into general purpose instances and special purpose states can be converted into special purpose instances. In an example, the general purpose instances can include an SME instance for an SME 204, 205 and a SME group instance for a hardware element comprising a group of SMEs. In an example, the SME group instance includes a GOT instance corresponding to a GOT 210; in other examples however, the SME group instance can correspond to a hardware element comprising a group of three or more SMEs. The special purpose instances can include a counter instance for a counter 224, and a logic instance for logic elements 224. Since a GOT 210 includes two SMEs 204, 205, a GOT instance contains two SME instances.

To create the netlist, states in the automaton are converted into instances in the netlist, except the starting state does not have a corresponding instance. SME states are converted into GOT instances and counter states are converted into counter instances. Additionally, a corresponding connection from a first instance to a second instance is created for a transition from a state corresponding to the first instance to a state corresponding to the second instance. Since the SMEs 204, 205 in the FSM engine 200 are grouped in pairs referred to as GOTs 210, the compiler can group SME states into pairs in a GOT instance. Due to physical design of a GOT 210, not all SME instances can be paired together to form a GOT 210. Accordingly, the compiler determines which SME states can be mapped together in a GOT 210, and then pairs the SME state into GOT instances based on the determination.

As shown in FIG. 5, a GOT 210 has output limitations on the SMEs 204, 205. In particular, the GOT 210 has a single output 218 shared by the two SMEs 204, 205. Accordingly, each SME 204, 205 in a GOT 210 cannot independently drive the output 218. This output limitation restricts which SMEs states can be paired together in a GOT instance. Notably, two SME states that drive (e.g., transition to, activate) different sets of external SME states (e.g., SME states corresponding to SMEs outside of the GOT instance) cannot be paired together in a GOT instance. This limitation, however, does not restrict whether the two SMEs states drive each other or self loop, since a GOT 210 can internally provide this functionality with the switches 240. Although the FSM engine 200 is described as having certain physical design corresponding to the SMEs 204, 205, in other examples, the SMEs 204, 205 may have other physical designs. For example, the SMEs 204, 205 may be grouped together into three or more sets of SMEs 204, 205. Additionally, in some examples, there may be limitations on the inputs 214, 216 to the SMEs 204, 205, with or without limitations on the outputs 226, 228 from the SMEs 204, 205.

In any case, however, the compiler determines which SME states can be grouped together based on the physical design of the FSM engine 200. Accordingly, for a GOT instance, the compiler determines which SME states can be paired together based on the output limitations for the SMEs 204, 205 in a GOT 210. In an example, there are five situations in which two SME states can be paired together to form a GOT 210 based on the physical design of the GOT 210.

The first situation when a first and a second SME state can be paired together in a GOT 210 occurs when neither the first or second SME state are final states, and when one of the first and second SME states does not drive any states other than the first or second SME states. As an example, a first state is considered to drive a second state when the first state transitions to the second state. When this first situation occurs, at most one of the first and second SME states is driving an external state(s). Accordingly, the first and second SME states can be paired together without being affected by the output limitations of the GOT 210. Due to the ability of the GOT 210 to couple the SMEs 204, 205 to one another internally, however, the first and second SME states are allowed to drive each other and self-loop to drive themselves. In automaton terms, the first SME state (corresponding to state q1) and the second SME state (corresponding to state q2) can be paired together when neither q1 nor q2 are final states, and $\delta(q1)-\{q1, q2\}$ is empty, or when $\delta(q2)-\{q1, q2\}$ is empty.

The second situation when a first and a second SME state can be paired together in a GOT 210 occurs when neither the first or second SME state are final states in the automaton, and when both the first and the second SME state drive the same external states. As used herein external states correspond to states outside of the GOT instance, for example, notwithstanding whether first and second SME states in a GOT instance drive each other or self loop. Here again, the output limitations of a GOT 210 do not affect the first and second SME states, since the first and second SME states drive the same external states. Also, due to ability of the GOT 210 to couple the SMEs 204, 205 to one another internally, the restriction on driving the same states does not include whether the first and second states drive each other or self-loop. Using automaton terms, the first SME state (corresponding to state q1) and the second SME state (corresponding to state q2) can be paired together when neither q1 nor q2 are final states, and $\delta(q1)-\{q1, q2\}=\delta(q2)-\{q1, q2\}$.

The third and fourth situations in which a first and a second SME state can be paired together in a GOT 210 occur when one of the first and second SME state are a final state and the other of the first and second SME state does not drive any external state. That is, the first SME state (corresponding to state q1) and the second SME state (corresponding to state q2) can be paired together when q1 is a final state and $\delta(q2)-\{q1, q2\}$ is empty, or when q2 corresponds to a final state and $\delta(q1)-\{q1, q2\}$ is empty. Since a final state outputs an indication of a match to a regex, a SME state corresponding to a final state should have independent use of the output 218 of the GOT 210 in order to indicate the match. Accordingly, the other SME state in the GOT 210 is not allowed to use the output 218.

The fifth situation when a first and a second SME state can be paired together in a GOT 210 occurs when both the first and second SME states correspond to final states in an automaton and both the first and the second SME states drive the same external states. Using automaton terms, the first state (corresponding to state q1) and the second SME state (corresponding to state q2) can be paired together when both q1 and q2 are final states, and $\delta(q1)-\{q1, q2\}=\delta(q2)-\{q1, q2\}$.

Once the compiler determines whether one or more SME states can be paired together, the compiler pairs the SMEs states into GOT instances. In an example, the compiler pairs SME states into GOT instances in the order they are determined to be capable of being paired to form a GOT instance. That is, once two particular SME states are determined to be capable of being paired together, these two SME states can be paired into a GOT instance. Once two SME states have been paired to form a GOT instance, these paired SME states are not available for pairing with other SME states. This process can continue until there are no longer any SME states left to be paired.

In an example, the compiler uses graph theory to determine which SMEs to pair together into a GOT instance. Since only certain SMEs can be paired together, some SME pairing can result in other SMEs having to be implemented in their own GOT instance with the other SME location in the GOT instance unused and hence wasted. Graph theory can be used to optimize SME utilization (e.g., reduce the number of unused SMEs) in the GOTs 210 by reducing the number of unused SME instances in the GOT instances of the netlist. To use graph theory, the compiler first determines all possible pairings between the SME states according to the physical design of the FSM engine 200 discussed above. The compiler then creates a graph where the vertices of the graph correspond to SME states and the edges of the graph correspond to possible pairings of the SME states. That is, if two SME states are determined to be capable of being paired together in a GOT instance, the two corresponding vertices are connected with an edge. Thus, the graph contains all the possible pairings of SME states.

The compiler can then find matching vertices for the graph to identify which SME states to pair together in a GOT 210. That is, the compiler identifies edges (and therefore pairs of vertices) such that no two edges between matching vertices of the graph share a common vertex. In an example, the compiler can find a maximal matching for the graph. In another example, the compiler can find a maximum matching for the graph. A maximum matching is a matching that contains the largest possible number of edges. There may be many maximum matchings. The problem of finding a maximum matching of a general graph can be solved in polynomial time.

Once all the matching vertices have been identified (e.g., as a maximum matching), each pair of SME states corresponding to matching vertices is mapped to a GOT instance. SME states corresponding to vertices that are un-matched are mapped to their own GOT instance. That is, SME states corresponding to vertices that are un-matched are mapped into one of SME location in GOT instance and the other SME location in the GOT instance is unused. Accordingly, given the netlist N and its corresponding set of matching vertices M, a number of GOT instances of N used equals $|Q|-1-|M|$, where Q is the set of states of the automaton, and "−1" is because in this example the starting state of the automaton does not correspond to an SME state.

In an example, the netlist N is constructed from the maximum matching M of G uses the least number of GOT instances. This can be proved by the following: if there exists another netlist N' that uses a lesser number of GOT instances, denote the corresponding matching as M'. Since the number of GOT instances of N' equals $|Q|-1-|M'|$, we have that $|M|<|M'|$. This conflicts with the fact that M is a maximum matching. Therefore, netlist N uses the least number of GOT instances.

Once the SME states are paired into GOT instances, the GOT instances, counter instances, and logic instances are connected according to the transitions between the states in the automaton. Since each GOT 210 has a single output, each GOT instance in the netlist has a single output port to connect to other instances. Accordingly, if either SME state in a first GOT instance drives an SME state in a second GOT instance, the output port of the first GOT instance is coupled to an input of the second GOT instance.

Figure 8B:
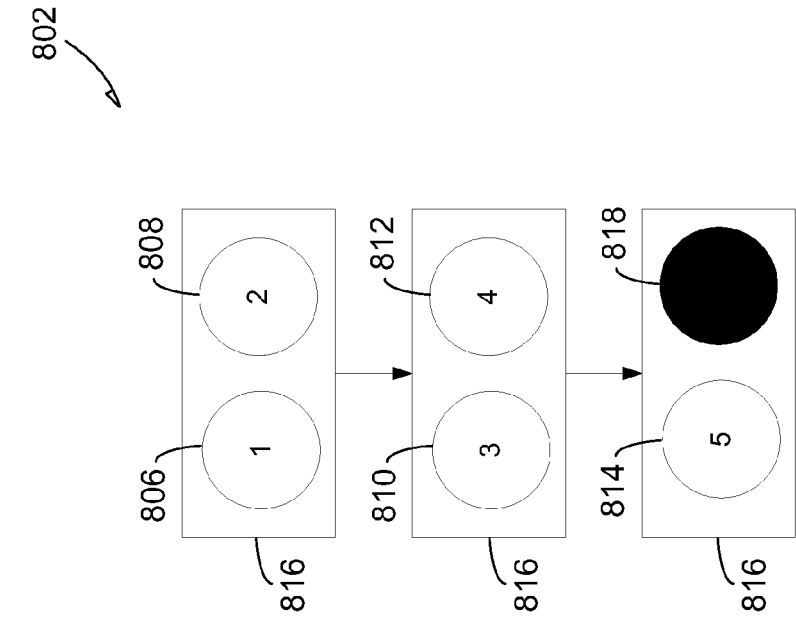
FIGS. 8A and 8B illustrate example netlists according to various embodiments of the invention.
Figure 8A:
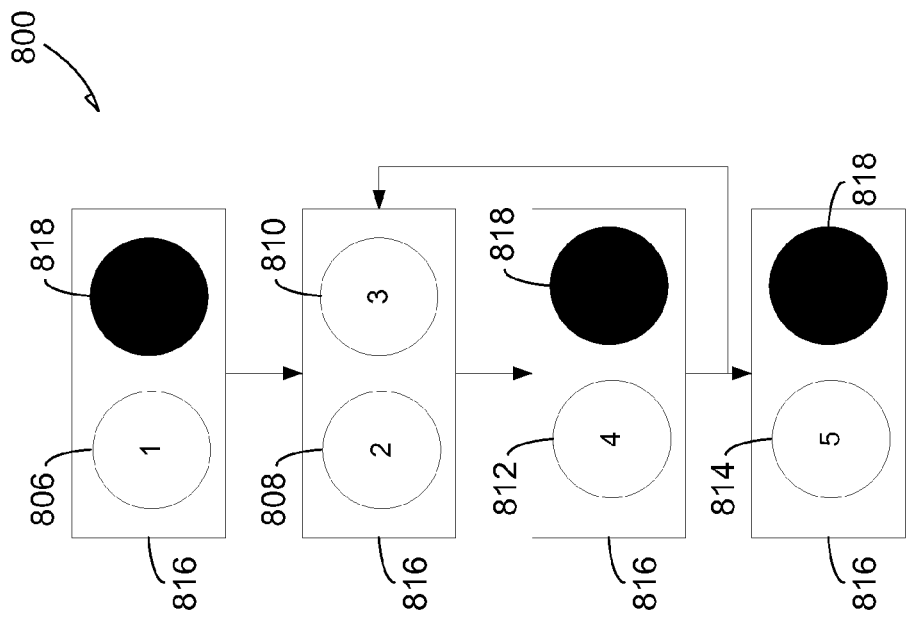

FIGS. 8A and 8B illustrate example netlists 800, 802 created from the homogeneous automaton 700 of FIG. 7A. The SME instances 806, 808, 810, 812, and 814 correspond to states 706, 708, 710, 712, and 714 in the automaton 700. The starting state 704 of the automaton does not correspond to an instance as discussed above.

The netlist 800 is an example of a non-optimal netlist. The netlist 800 uses four GOT instances 816 while leaving three SME instances 818 unused. The netlist 802, however, is an example of an optimal netlist created using graph theory to identify a maximum matching. The netlist 802 uses three GOT instances 816 and has a single unused SME instance 818. In the netlist 802, the instance 810 can be connected to instance 812 with connections internal to the GOT instance (e.g., via switch 240).

At block 610, once the netlist has been generated, the netlist is placed to select a specific hardware element of the target device (e.g., SMEs 204, 205, other elements 224) for each instance of the netlist. According to an embodiment of the present invention, placing selects the hardware elements based on general input and output constraints for the hardware elements.

At block 612, the globally placed netlist is routed to determine the settings for the programmable switches (e.g., inter-block switches 203, intra-block switches 208, and intra-row switches 212) in order to couple the selected hardware elements together to achieve the connections describe by the netlist. In an example, the settings for the programmable switches are determined by determining specific conductors of the FSM engine 200 that will be used to connect the selected hardware elements, and the settings for the programmable switches. Routing may adjust the specific hardware elements selected for some of the netlist instances during placement, such as in order to couple hardware elements given the physical design of the conductors and/or switches on the FSM engine 200.

Once the netlist is placed and routed, the placed and routed netlist can be converted into a plurality of bits for programming of a FSM engine 200. The plurality of bits are referred to herein as an image.

At block 614, an image is published by the compiler. The image comprises a plurality of bits for programming specific hardware elements and/or programmable switches of the FSM engine 200. In embodiments where the image comprises a plurality of bits (e.g., 0 and 1), the image can be referred to as a binary image. The bits can be loaded onto the FSM engine 200 to program the state of SMEs 204, 205, the special purpose elements 224, and the programmable switches such that the programmed FSM engine 200 implements a FSM having the functionality described by the source code. Placement (block 610) and routing (block 612) can map specific hardware elements at specific locations in the FSM engine 200 to specific states in the automaton. Accordingly, the bits in the image can program the specific hardware elements and/or programmable switches to implement the desired function(s).

In an example, the image can be published by saving the machine code to a computer readable medium. In another example, the image can be published by displaying the image on a display device. In still another example, the image can be published by sending the image to another device, such as a programming device for loading the image onto the FSM engine 200. In yet another example, the image can be published by loading the image onto a parallel machine (e.g., the FSM engine 200).

In an example, an image can be loaded onto the FSM engine 200 by either directly loading the bit values from the image to the SMEs 204, 205 and other hardware elements 224 or by loading the image into one or more registers and then writing the bit values from the registers to the SMEs 204, 205 and other hardware elements 224. In an example, the state of the programmable switches (e.g., inter-block switches 203, intra-block switches 208, and intra-row switches 212). In an example, the hardware elements (e.g., SMEs 204, 205, other elements 224, programmable switches 203, 208, 212) of the FSM engine 200 are memory mapped such that a programming device and/or computer can load the image onto the FSM engine 200 by writing the image to one or more memory addresses.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

FIG. 9 illustrates generally an example of a computer 900 having a Von Nuemann architecture. Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that can be employed to create one or more software programs designed to implement and perform the methods disclosed herein. The programs can be structured in an object-orientated format using an object-oriented language, such as Java, C++, or one or more other languages. Alternatively, the programs can be structured in a procedure-orientated format using a procedural language, such as assembly, C, etc. The software components can communicate using any of a number of mechanisms well known to those of ordinary skill in the art, such as application program interfaces or interprocess communication techniques, including remote procedure calls or others. The teachings of various embodiments are not limited to any particular programming language or environment.

Thus, other embodiments can be realized. For example, an article of manufacture, such as a computer, a memory system, a magnetic or optical disk, some other storage device, or any type of electronic device or system can include one or more processors 902 coupled to a computer-readable medium 922 such as a memory (e.g., removable storage media, as well as any memory including an electrical, optical, or electromagnetic conductor) having instructions 924 stored thereon (e.g., computer program instructions), which when executed by the one or more processors 902 result in performing any of the actions described with respect to the methods above.

The computer 900 can take the form of a computer system having a processor 902 coupled to a number of components directly, and/or using a bus 908. Such components can include main memory 904, static or non-volatile memory 906, and mass storage 916. Other components coupled to the processor 902 can include an output device 910, such as a video display, an input device 912, such as a keyboard, and a cursor control device 914, such as a mouse. A network interface device 920 to couple the processor 902 and other components to a network 926 can also be coupled to the bus 908. The instructions 924 can further be transmitted or received over the network 926 via the network interface device 920 utilizing any one of a number of well-known transfer protocols (e.g., HTTP). Any of these elements coupled to the bus 908 can be absent, present singly, or present in plural numbers, depending on the specific embodiment to be realized.

In an example, one or more of the processor 902, the memories 904, 906, or the storage device 916 can each include instructions 924 that, when executed, can cause the computer 900 to perform any one or more of the methods described herein. In alternative embodiments, the computer 900 operates as a standalone device or can be connected (e.g., networked) to other devices. In a networked environment, the computer 900 can operate in the capacity of a server or a client device in server-client network environment, or as a peer device in a peer-to-peer (or distributed) network environment. The computer 900 can include a personal computer (PC), a tablet PC, a set-top box (STB), a Personal Digital Assistant (PDA), a cellular telephone, a web appliance, a network router, switch or bridge, or any device capable of executing a set of instructions (sequential or otherwise) that specify actions to be taken by that device. Further, while only a single computer 900 is illustrated, the term "computer" shall also be taken to include any collection of devices that individually or jointly execute a set (or multiple sets) of instructions to perform any one or more of the methodologies discussed herein.

The computer 900 can also include an output controller 928 for communicating with peripheral devices using one or more communication protocols (e.g., universal serial bus (USB), IEEE 1394, etc.) The output controller 928 can, for example, provide an image to a programming device 930 that is communicatively coupled to the computer 900. The programming device 930 can be configured to program a parallel machine (e.g., parallel machine 100, FSM engine 200). In other examples, the programming device 930 can be integrated with the computer 900 and coupled to the bus 908 or can communicate with the computer 900 via the network interface device 920 or another device.

While the computer-readable medium 924 is shown as a single medium, the term "computer-readable medium" should be taken to include a single medium or multiple media (e.g., a centralized or distributed database, or associated caches and servers, and or a variety of storage media, such as the processor 902 registers, memories 904, 906, and the storage device 916) that store the one or more sets of instructions 924. The term "computer-readable medium" shall also be taken to include any medium that is capable of storing, encoding or carrying a set of instructions for execution by the computer and that cause the computer to perform any one or more of the methodologies of the present invention, or that is capable of storing, encoding or carrying data structures utilized by or associated with such a set of instructions. The term "computer-readable medium" shall accordingly be taken to include, but not be limited to tangible media, such as solid-state memories, optical, and magnetic media.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

EXAMPLE EMBODIMENTS

Example 1 includes a computer-implemented method for generating an image configured to program a parallel machine from source code. The method includes converting source code into an automaton comprising a plurality of interconnected states; converting the automaton into a netlist comprising instances corresponding to states of the automaton, wherein the instances correspond to hardware elements of the parallel machine, wherein converting the automaton into a netlist includes grouping states together based on a physical design of the parallel machine; and converting the netlist into the image.

Example 2 includes a computer-readable medium including instructions, which when executed by the computer, cause the computer to perform operations. The operations including converting source code into an automaton comprising a plurality of interconnected states; converting the automaton into a netlist comprising instances corresponding to states of the automaton, wherein the instances correspond to hardware elements of the parallel machine, wherein converting the automaton into a netlist includes grouping states together based on a physical design of the parallel machine; and converting the netlist into the image.

Example 3 includes a computer including a memory having software stored thereon; and a processor communicatively coupled to the memory. Wherein the software, when executed by the processor, causes the processor to: convert source code into an automaton comprising a plurality of interconnected states; convert the automaton into a netlist comprising instances corresponding to states of the automaton, wherein the instances correspond to hardware elements of the parallel machine, wherein the instances include a plurality of first instances and a group instance containing two or more first instances, wherein convert the automaton into a netlist includes group states together in a group instance based on a number of unused first instances; and convert the netlist into the image.

Example 4 includes a system including a computer configured to: convert source code into an automaton comprising a plurality of interconnected states; convert the automaton into a netlist comprising instances corresponding to states of the automaton, wherein the instances correspond to hardware elements of the parallel machine, wherein the instances include a plurality of first instances and a group instance containing two or more first instances, wherein convert the automaton into a netlist includes group states together in a group instance based on a number of unused first instances; and convert the netlist into the image. The system also includes a device configured to load the image onto a parallel machine.

In Example 5, the subject matter of any of Examples 1-4 can optionally include wherein the instances include a state machine element (SME) instance corresponding to a SME hardware elements and a SME group instance corresponding to a hardware element comprising a group of SMEs, and wherein grouping includes grouping states into a SME group instance.

In Example 6, the subject matter of any of Examples 1-5 can optionally include wherein the physical design includes a physical design of the hardware element comprising a group of SMEs.

In Example 7, the subject matter of any of Examples 1-6 can optionally include wherein the physical design includes one of an input or output limitation on the SMEs in the hardware element comprising a group of SMEs.

In Example 8, the subject matter of any of Examples 1-7 can optionally include wherein the physical design includes a limitation that the SMEs in the hardware element comprising a group of SMEs share an output.

In Example 9, the subject matter of any of Examples 1-8 can optionally include wherein a SME group instance includes a group of two (GOT) instance containing two SME instances, and wherein the physical design includes that the SMEs in each GOT are coupled to a common output.

In Example 10, the subject matter of any of Examples 1-9 can optionally include wherein converting the automaton into a netlist comprises: determining which of the states can be grouped together in a GOT instance; and pairing the states based on the determination.

In Example 11, the subject matter of any of Examples 1-10 can optionally include wherein a first and a second state can be paired together in a GOT instance when neither the first nor the second state are a final state of the automaton, and one of the first and the second state does not drive any states other than the first or the second states.

In Example 12, the subject matter of any of Examples 1-11 can optionally include wherein a first and a second state can be paired together in a GOT instance when neither the first nor the second state are a final state of the automaton, and both the first and the second state drive the same external states.

In Example 13, the subject matter of any of Examples 1-12 can optionally include wherein a first and a second state can be paired together in a GOT instance when one of the first and the second state are a final state of the automaton, and the other of the first and the second states does not drive any external states.

In Example 14, the subject matter of any of Examples 1-13 can optionally include wherein a first and a second state can be paired together in a GOT instance when both the first and the second state are final states of the automaton and both the first and the second state drive the same external states.

In Example 15, the subject matter of any of Examples 1-14 can optionally include wherein determining which of the states can be grouped together in a GOT instance comprises determining which of the states can be grouped together in a GOT instance using graph theory.

In Example 16, the subject matter of any of Examples 1-15 can optionally include wherein determining which of the states can be grouped together in a GOT instance using graph theory comprises determining which of the states can be grouped together in a GOT instance using graph theory to identify a maximum matching.

In Example 17, the subject matter of any of Examples 1-16 can optionally include publishing the image.

In Example 18, the subject matter of any of Examples 1-17 can optionally include wherein the instances comprise general purpose instances and special purpose instances, wherein the general purpose instances correspond to general purpose states of the automaton and the special purpose instances correspond to special purpose states of the automaton.

In Example 19, the subject matter of any of Examples 1-18 can optionally include wherein the hardware elements corresponding to the general purpose instances include a state machine elements (SME) and a group of two (GOT) and wherein the hardware elements corresponding to the special purpose instances include counters and logic elements.

In Example 20, the subject matter of any of Examples 1-19 can optionally include wherein the automaton is a homogeneous automaton.

In Example 21, the subject matter of any of Examples 1-20 can optionally include wherein converting the automaton into a netlist comprises mapping each of the states of the automaton to an instance corresponding to the hardware elements and determining the connectivity between the instances.

In Example 22, the subject matter of any of Examples 1-21 can optionally include wherein the netlist further comprises a plurality of connections between the instances representing conductors between the hardware elements.

In Example 23, the subject matter of any of Examples 1-22 can optionally include wherein converting the automaton into a netlist comprises converting the automaton into a netlist comprising instances corresponding to states of the automaton except for a starting state.

In Example 24, the subject matter of any of Examples 1-23 can optionally include determining the location in the parallel machine of the hardware elements corresponding to the instances of the netlist.

In Example 25, the subject matter of any of Examples 1-24 can optionally include, wherein grouping states together includes grouping states together based on a physical design of a hardware element comprising a group of general purpose elements.

In Example 26, the subject matter of any of Examples 1-25 can optionally include determining which conductors of the parallel machine will be used to connect the hardware elements; and determining settings for programmable switches of the parallel machine, wherein the programmable switches are configured to selectively couple together the hardware elements.

In Example 27, the subject matter of any of Examples 1-26 can optionally include wherein the group instance includes a group of two (GOT) instance and wherein group states includes pair states as a function of which states the paired states drive.

In Example 28, the subject matter of any of Examples 1-27 can optionally include wherein group states in a group instance based on a number of unused first instances includes: determine whether a first state and a second state can be paired based on the following conditions: neither the first state or second state are final states in the automaton, and one of the first state and second state does not drive any states other than the first or second states; neither the first or second state are final states in the automaton, and both the first state and the second state drive the same external states; either the first state or the second state are a final state and the first state or second state that is not a final state does not drive any states except the first state or second state; and both the first state and the second state are final states and both the first state and the second state drive the same external states.

In Example 29, the subject matter of any of Examples 1-28 can optionally include wherein convert the automaton into a netlist includes: model the states as a graph wherein vertices of the graph correspond to states and edges of the graph correspond to possible pairings of the states; determine matching vertices for the graph; and pair states corresponding to the matching vertices.

In Example 30, the subject matter of any of Examples 1-29 can optionally include wherein convert the automaton into a netlist includes: determine a maximum matching for the graph.

In Example 31, the subject matter of any of Examples 1-30 can optionally include wherein convert the automaton into a netlist includes: pair each set of states corresponding to a matching vertices; and map each state that corresponds to an unmatched vertex to a GOT instance wherein one SME instance in the GOT instance is to be unused.

In Example 32, the subject matter of any of Examples 1-31 can optionally include wherein group states together includes: pair states as a function of which states the paired states drive.

In Example 33, the subject matter of any of Examples 1-32 can optionally include wherein group states together in a group instance based on a number of unused first instances includes: determine whether a first state and a second state can be paired based on the following conditions: neither the first state or second state are final states in the automaton, and one of the first state and second state does not drive any states other than the first or second states; neither the first or second state are final states in the automaton, and both the first state and the second state drive the same external states; either the first state or the second state are a final state and the first state or second state that is not a final state does not drive any states except the first state or second state; and both the first state and the second state are final states and both the first state and the second state drive the same external states.

In Example 34, the subject matter of any of Examples 1-33 can optionally include wherein group states together in a group instance based on a number of unused first instances includes: model the states as a graph wherein vertices of the graph correspond to states and edges of the graph correspond to possible pairings of the states; determine matching vertices for the graph; and pair states corresponding to the matching vertices.

In Example 35, the subject matter of any of Examples 1-34 can optionally include wherein group states together in a group instance based on a number of unused first instances: determine a maximum matching for the graph.

In Example 36, the subject matter of any one of Examples 1-35 can optionally include wherein group states together in a group instance based on a number of unused first instances includes: pair each set of states corresponding to a matching vertices; and map each state that corresponds to an unmatched vertex to a GOT instance wherein one SME instance in the GOT instance is to be unused.

In Example 37, the subject matter of any of Examples 1-36 can optionally include wherein the device is configured to implement each pair of states as a group of two hardware element in the parallel machine.

Example 38 includes a parallel machine programmed by an image produced by the process of any of Examples 1-37.

What is claimed is:

1. A computer-implemented method for generating an image configured to program a parallel machine from source code, the method comprising:
    converting source code of an uncompiled executable software application into an automaton comprising a plurality of interconnected states;
    converting the automaton into a netlist, the netlist comprising instances corresponding to states of the automaton, wherein the instances correspond to hardware elements of the parallel machine, wherein converting the automaton into a netlist includes grouping states of the automaton together based on a physical design of the parallel machine; and
    converting the netlist into the image, the image comprising compiled binary data to program the parallel machine to correspond to the instances of the netlist, such that the compiled binary data is arranged to program the parallel machine to provide the functionality specified by the source code of the uncompiled executable software application when the image is loaded onto the parallel machine.

2. The method of claim 1, wherein the instances of the netlist include a state machine element (SME) instance corresponding to SME hardware elements and a SME group instance corresponding to a hardware element comprising a group of SMEs, and wherein grouping the states of the automaton together includes grouping the states of the automaton into a SME group instance.

3. The method of claim 2, wherein the physical design used in grouping the states of the automaton together includes a physical design of the hardware element comprising a group of SMEs.

4. The method of claim 3, wherein the physical design used in grouping the states of the automaton together includes one of an input or output limitation on the SMEs in the hardware element comprising a group of SMEs.

5. The method of claim 4, wherein the physical design used in grouping the states of the automaton together includes a limitation that the SMEs in the hardware element comprising a group of SMEs share an output.

6. The method of claim 2, wherein a SME group instance includes a group of two (GOT) instance containing two SME instances, and wherein the physical design used in grouping the states of the automaton together includes a limitation that the SMEs in each GOT are coupled to a common output.

7. The method of claim 6, wherein converting the automaton into a netlist comprises:
    determining which of the states of the automaton can be grouped together in a GOT instance; and
    pairing the states of the automaton based on the determination.

8. The method of claim 7, wherein a first and a second state of the automaton can be paired together in a GOT instance when neither the first nor the second state of the automaton are a final state of the automaton, and one of the first and the second state of the automaton does not drive any states other than the first or the second states of the automaton.

9. The method of claim 7, wherein a first and a second state of the automaton can be paired together in a GOT instance when neither the first nor the second state of the automaton are a final state of the automaton, and both the first and the second state of the automaton drive the same external states.

10. The method of claim 7, wherein a first and a second state of the automaton can be paired together in a GOT instance when one of the first and the second state of the automaton are a final state of the automaton, and the other of the first and the second states of the automaton does not drive any external states.

11. The method of claim 7, wherein a first and a second state of the automaton can be paired together in a GOT instance when both the first and second state of the automaton are final states of the automaton and both the first and the second state of the automaton drive the same external states.

12. The method of claim 7, wherein determining which of the states of the automaton can be grouped together in a GOT instance comprises determining which of the states of the automaton can be grouped together in a GOT instance using graph theory.

13. The method of claim 12, wherein determining which of the states of the automaton can be grouped together in a GOT instance using graph theory comprises determining which of the states of the automaton can be grouped together in a GOT instance using graph theory to identify a maximum matching.

14. The method of claim 1, further comprising:
publishing the image.

15. The method of claim 1, wherein the instances of the netlist comprise general purpose instances and special purpose instances, wherein the general purpose instances correspond to general purpose states of the automaton and the special purpose instances correspond to special purpose states of the automaton.

16. The method of claim 15, wherein the hardware elements corresponding to the general purpose instances include a state machine elements (SME) and a group of two (GOT) and wherein the hardware elements corresponding to the special purpose instances include counters and logic elements.

17. A parallel machine programmed by the image produced by the process of claim 1.

18. A computer-readable medium that is not a transitory propagating signal, the computer-readable medium including instructions, which when executed by the computer, cause the computer to perform operations comprising:
converting source code of an uncompiled executable software application into an automaton comprising a plurality of interconnected states;
converting the automaton into a netlist, the netlist comprising instances corresponding to states of the automaton, wherein the instances correspond to hardware elements of the parallel machine, wherein converting the automaton into a netlist includes grouping states of the automaton together based on a physical design of the parallel machine; and
converting the netlist into an image, the image comprising compiled binary data to program the parallel machine to correspond to the instances of the netlist, such that the compiled binary data is arranged to program the parallel machine to provide the functionality specified by the source code of the uncompiled executable software application when the image is loaded onto the parallel machine.

19. The computer-readable medium of claim 18, wherein the automaton is a homogeneous automaton.

20. The computer-readable medium of claim 18, wherein converting the automaton into a netlist comprises mapping each of the states of the automaton to an instance corresponding to the hardware elements and determining the connectivity between the instances.

21. The computer-readable medium of claim 18, wherein the netlist further comprises a plurality of connections between the instances representing conductors between the hardware elements.

22. The computer-readable medium of claim 18, wherein converting the automaton into a netlist comprises converting the automaton into a netlist comprising instances corresponding to states of the automaton except for a starting state.

23. The computer-readable medium of claim 18, wherein the instructions cause the computer to perform operations comprising:
determining the location in the parallel machine of the hardware elements corresponding to the instances of the netlist.

24. The computer-readable medium of claim 23, wherein grouping the states of the automaton together includes grouping the states of the automaton together based on a physical design of a hardware element comprising a group of general purpose elements.

25. The computer-readable medium of claim 23, wherein the instructions cause the computer to perform operations comprising:
determining which conductors of the parallel machine will be used to connect the hardware elements; and
determining settings for programmable switches of the parallel machine, wherein the programmable switches are configured to selectively couple together the hardware elements.

26. A computer comprising:
a memory having software stored thereon; and
a processor communicatively coupled to the memory, wherein the software, when executed by the processor, causes the processor to:
convert source code of an uncompiled executable software application into an automaton comprising a plurality of interconnected states;
convert the automaton into a netlist, the netlist comprising instances corresponding to states of the automaton, wherein the instances correspond to hardware elements of a parallel machine, wherein the instances include a plurality of first instances and a group instance containing two or more first instances, wherein operations to convert the automaton into a netlist include operations to group states of the automaton together in a group instance based on a number of unused first instances; and
convert the netlist into an image, the image comprising compiled binary data to program the parallel machine to correspond to the instances of the netlist,
such that the compiled binary data is arranged to program the parallel machine to provide the functionality specified by the source code of the uncompiled executable software application when the image is loaded onto the parallel machine.

27. The computer of claim 26, wherein the group instance includes a group of two (GOT) instance and wherein operations to group states of the automaton include operations to pair states of the automaton as a function of which states the paired states drive.

28. The computer of claim 27, wherein operations to group states of the automaton in a group instance based on a number of unused first instances include operations to:

determine whether a first state and a second state of the automaton can be paired based on the following conditions:
neither the first state or second state are final states in the automaton, and one of the first state and second state does not drive any states other than the first or second states;
neither the first or second state are final states in the automaton, and both the first state and the second state drive the same external states;
either the first state or the second state are a final state and the first state or second state that is not a final state does not drive any states except the first state or second state; and
both the first state and the second state are final states and both the first state and the second state drive the same external states.

29. The computer of claim 26, wherein operations to convert the automaton into a netlist include operations to:
model the states of the automaton as a graph wherein vertices of the graph correspond to states and edges of the graph correspond to possible pairings of the states of the automaton;
determine matching vertices for the graph; and
pair states of the automaton corresponding to the matching vertices.

30. The computer of claim 29, wherein operations to convert the automaton into a netlist include operations to:
determine a maximum matching for the graph.

31. The computer of claim 30, wherein operations to convert the automaton into a netlist include operations to:
pair each set of states of the automaton corresponding to a matching vertices; and
map each state of the automaton that corresponds to an unmatched vertex to a GOT instance wherein one SME instance in the GOT instance is to be unused.

32. A system comprising:
a computer configured to:
convert source code of an uncompiled executable software application into an automaton comprising a plurality of interconnected states;
convert the automaton into a netlist, the netlist comprising instances corresponding to states of the automaton, wherein the instances correspond to hardware elements of a parallel machine, wherein the instances include a plurality of first instances and a group instance containing two or more first instances, wherein operations to convert the automaton into a netlist include operations to group states of the automaton together in a group instance based on a number of unused first instances; and
convert the netlist into an image, the image comprising compiled binary data to program the parallel machine to correspond to the instances of the netlist, such that the compiled binary data is arranged to program the parallel machine to provide the functionality specified by the source code of the uncompiled executable software application when the image is loaded onto the parallel machine; and
a device configured to load the image onto the parallel machine.

33. The system of claim 32, wherein operations to group states together include operations to:
pair states of the automaton as a function of which states the paired states drive.

34. The system of claim 32, wherein operations to group states of the automaton together in a group instance based on a number of unused first instances include operations to:
determine whether a first state of the automaton and a second state of the automaton can be paired based on the following conditions:
neither the first state or second state are final states in the automaton, and one of the first state and second state does not drive any states other than the first or second states;
neither the first or second state are final states in the automaton, and both the first state and the second state drive the same external states;
either the first state or the second state are a final state and the first state or second state that is not a final state does not drive any states except the first state or second state; and
both the first state and the second state are final states and both the first state and the second state drive the same external states.

35. The system of claim 32, wherein operations to group states of the automaton together in a group instance based on a number of unused first instances include operations to:
model the states as a graph wherein vertices of the graph correspond to states and edges of the graph correspond to possible pairings of the states;
determine matching vertices for the graph; and
pair states corresponding to the matching vertices.

36. The system of claim 35, wherein operations to group states of the automaton together in a group instance based on a number of unused first instances include operations to:
determine a maximum matching for the graph.

37. The system of claim 36, wherein operations to group states of the automaton together in a group instance based on a number of unused first instances include operations to:
pair each set of states of the automaton corresponding to a matching vertices; and
map each state of the automaton that corresponds to an unmatched vertex to a GOT instance wherein one SME instance in the GOT instance is to be unused.

38. The system of claim 32, wherein the device is configured to implement each pair of states of the automaton as a group of two (GOT) hardware element in the parallel machine.

* * * * *